United States Patent
Lai et al.

(12)

(10) Patent No.: US 9,713,280 B2
(45) Date of Patent: Jul. 18, 2017

(54) STANDALONE UNINTERRUPTIBLE POWER SUPPLY

(71) Applicant: DELTA ELECTRONICS, INC., Taoyuan County (TW)

(72) Inventors: Yuan-Fang Lai, Taoyuan County (TW); Ying-Sung Chang, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 1 day.

(21) Appl. No.: 14/935,802

(22) Filed: Nov. 9, 2015

(65) Prior Publication Data

US 2016/0316586 A1    Oct. 27, 2016

(30) Foreign Application Priority Data

Apr. 24, 2015   (TW) .............................. 104113213 A

(51) Int. Cl.

| | |
|---|---|
| H05K 7/20 | (2006.01) |
| H05K 7/14 | (2006.01) |
| G06F 1/18 | (2006.01) |
| G06F 1/30 | (2006.01) |
| H02B 1/36 | (2006.01) |
| H02J 9/04 | (2006.01) |

(52) U.S. Cl.
CPC ........... *H05K 7/1492* (2013.01); *G06F 1/188* (2013.01); *G06F 1/30* (2013.01); *H02B 1/36* (2013.01); *H02J 9/04* (2013.01); *H05K 7/1432* (2013.01)

(58) Field of Classification Search
CPC .......................... G06F 13/4068; G06F 13/409
See application file for complete search history.

(56) References Cited

U.S. PATENT DOCUMENTS 5,801,632 A * 9/1998 Opal ...................... H04M 11/04
340/585
5,801,921 A * 9/1998 Miller ...................... G06F 1/183
174/72 A
(Continued)

FOREIGN PATENT DOCUMENTS

CN    101604857    12/2009
EP    0274292    7/1988
(Continued)

OTHER PUBLICATIONS

Office Action dated Jul. 21, 2016 from corresponding application No. TW 104113213.
(Continued)

*Primary Examiner* — Anthony Q Edwards
(74) *Attorney, Agent, or Firm* — Hauptman Ham, LLP

(57) ABSTRACT

A standalone uninterruptible power supply includes a cabinet and a power supply unit. The cabinet has a frame, rails and carrier plates removably disposed on the rails. The power supply unit installed in the frame includes a control module, a power input module, a power output module and cables. The control module is installed in one carrier plate. The power input module and the power output module are electrically connected with the control module and installed in another carrier plate. The cables are detachably connected with the control module, the input module and the power output module.

14 Claims, 6 Drawing Sheets

(56) References Cited

U.S. PATENT DOCUMENTS

| | | | | |
|---|---|---|---|---|
| 5,966,292 A * | 10/1999 | Amberg | G06F 1/189 | 361/730 |
| 6,310,783 B1 * | 10/2001 | Winch | H01M 2/1077 | 361/679.02 |
| 6,331,938 B1 * | 12/2001 | Hsieh | G06F 1/1632 | 361/692 |
| 6,362,974 B1 * | 3/2002 | Lettang | G06F 1/183 | 257/686 |
| 6,657,123 B2 * | 12/2003 | Moore | H02B 1/32 | 174/38 |
| 7,397,654 B2 * | 7/2008 | Mori | H02J 9/00 | 320/114 |
| 7,560,831 B2 * | 7/2009 | Whitted | H02J 9/061 | 307/64 |
| 7,646,590 B1 * | 1/2010 | Corhodzic | H05K 7/1492 | 361/622 |
| 7,719,835 B1 * | 5/2010 | Schluter | H05K 7/1457 | 174/17 R |
| 8,589,608 B2 * | 11/2013 | Brodsky | G06F 13/409 | 361/748 |
| 8,614,890 B2 * | 12/2013 | Hensley | H05K 5/0021 | 312/223.2 |
| 8,738,828 B2 * | 5/2014 | Brodsky | G06F 13/4217 | 361/749 |
| 8,879,241 B2 * | 11/2014 | Lu | G06F 1/181 | 174/149 B |
| 8,934,260 B2 * | 1/2015 | Tanaka | G06F 1/184 | 361/737 |
| 8,947,888 B2 * | 2/2015 | Peterson | H04Q 1/155 | 361/776 |
| 9,462,707 B2 * | 10/2016 | Wright | H05K 5/0004 | |
| 2005/0162019 A1 * | 7/2005 | Masciarelli | H02J 9/062 | 307/66 |
| 2008/0122289 A1 * | 5/2008 | Best | H05K 7/1457 | 307/25 |
| 2010/0043858 A1 * | 2/2010 | Matsui | H05K 7/20772 | 136/205 |
| 2011/0255230 A1 * | 10/2011 | Mori | H05K 7/1492 | 361/679.02 |
| 2011/0278934 A1 * | 11/2011 | Ghosh | H02J 9/062 | 307/66 |
| 2012/0033396 A1 * | 2/2012 | Goedknegt | H02B 1/28 | 361/807 |
| 2012/0218698 A1 * | 8/2012 | Brodsky | G06F 1/183 | 361/679.02 |
| 2014/0160686 A1 * | 6/2014 | Benson | H05K 7/2089 | 361/724 |
| 2014/0240914 A1 * | 8/2014 | Meert | H04Q 1/06 | 361/679.31 |
| 2015/0116913 A1 * | 4/2015 | Kwon | H05K 7/1492 | 361/624 |
| 2015/0181750 A1 * | 6/2015 | Bailey | H05K 7/20736 | 361/679.48 |
| 2015/0189787 A1 * | 7/2015 | Bailey | H05K 7/1489 | 361/679.48 |

FOREIGN PATENT DOCUMENTS

| | | |
|---|---|---|
| EP | 0575101 | 12/1993 |
| TW | 200632634 | 9/2006 |
| TW | 200945014 | 11/2009 |
| TW | M379137 | 4/2010 |
| TW | 201134059 | 10/2011 |
| TW | 201220023 | 5/2012 |

OTHER PUBLICATIONS

The Partial European Search Report dated Dec. 3, 2015 from corresponding application No. EP15193189.6.

* cited by examiner

STANDALONE UNINTERRUPTIBLE POWER SUPPLY

BACKGROUND OF THE INVENTION

1. Field of the Invention

The present invention relates to an uninterruptible power supply, and more particularly to a standalone uninterruptible power supply.

2. Description of the Prior Art

An uninterruptible power supply has been widely used in important computer systems, thus a temporary power can be provided in time for computer systems operating normally when a power outage or an unstable power supply is happened.

A traditional standalone uninterruptible power supply (independent uninterruptible power supply system) includes not only a cabinet but also components such as transformers, heatsink, routes, filters and wires. As the UPS has a certain weight and volume, it is not easy to move or transport at will. Besides, there are a number of modules in the cabinet that docking terminals are required for connections between the modules. Moreover, the maintenance time of a traditional standalone UPS is long because it is often required to be disassembled step by step and even needs to disassemble from a lateral side or a backside when it needs repairs. Besides, some parts of the UPS systems have more difficulty to do the repairs when they are configured by combining two cabinets.

In view of the above drawbacks, the Inventor proposes the present invention based on his expert knowledge and elaborate researches in order to solve the problems of prior art.

SUMMARY OF THE INVENTION

The present invention is directed to provide a standalone uninterruptible power supply, in which modules placed in carrier plates are provided on rails and can be capable of removing from the rails in a manner of extracting individually, thus a simplified maintenance can be achieved.

According to an embodiment of the present invention, an uninterruptible power supply comprises a cabinet and a power supply unit. The cabinet includes a frame, a plurality of rails arranged in an inner wall of the frame at intervals, and a plurality of carrier plates removably disposed on the rails. The power supply unit is installed in the frame and includes a control module, at least one power input module, at least one power output module, and a plurality of cables. The control module is provided in one of the carrier plates. The power input module is electrically connected with the control module and provided in another carrier plate. The power output module is electrically connected with the control module and provided in another carrier plate. The cables are detachably connected with the control module, the power input module, and the power output module, wherein the power input module and the power output module are electrically connected with the control module through the cables.

According to an embodiment of the present invention, an uninterruptible power supply comprises a cabinet and a plurality of power supply units. The cabinet includes a frame, a plurality of rails arranged in an inner wall of the frame at intervals, and a plurality of carrier plates removably disposed on the rails. The power supply units are installed individually in the frame and are electrically connected to each other. Each power supply unit includes a control module, at least one power input module, at least one power output module, and a plurality of cables. The control module is provided in one of the carrier plates. The power input module is electrically connected with the control module and provided in another carrier plate. The power output module is electrically connected with the control module and provided in another carrier plate. The cables are detachably connected with the control module, the power input module, and the power output module, wherein the power input module and the power output module are electrically connected with the control module through the cables.

According to an embodiment of the present invention, an uninterruptible power supply comprises a cabinet and a power supply unit. The cabinet includes a frame, a plurality of rails arranged in an inner wall of the frame at intervals, and a plurality of carrier plates removably disposed on the rails. The power supply unit is installed in the frame and includes a control module, at least one power input module, at least one power output module, and a plurality of cables. The control module is provided in one of the carrier plates. The power input module is electrically connected with the control module. The power output module is electrically connected with the control module. The cables are detachably connected with the control module, the power input module, and the power output module, wherein the power input module and the power output module are provided in combination or separately in another carrier plate.

Comparing to prior arts, the uninterruptible power supply of the present invention has a cabinet comprising a plurality of rails arranged at intervals and a plurality of carrier plates removably disposed on the rails. In addition, the control module, the power input module and the power output module are disposed separately in different carrier plates, and cables are provided for electrical connections between modules. Thereby, when the uninterruptible power supply does not work or needs to be checked, cables should be detached firstly, and then the module (with a carrier plate) which needs to be checked or replaced can be taken out from the rails of the cabinet. Thus the control module, the power input module, and the power output module can be checked or replaced individually. On the contrary, conventional modular UPS adopts expensive docking terminals and complex docking structures. As the electrical connection and structures of the carrier plates and rails are simple and has high commonality, the present invention has an advantage of cost with comparing to conventional modular UPS. Also, the present invention has a better maintainability than an existing standalone UPS that a simplified maintenance of standalone UPS can be achieved.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWING

The above and further advantages of this invention may be better understood by referring to the following description, taken in conjunction with the accompanying drawings, in which.

Figure 1:
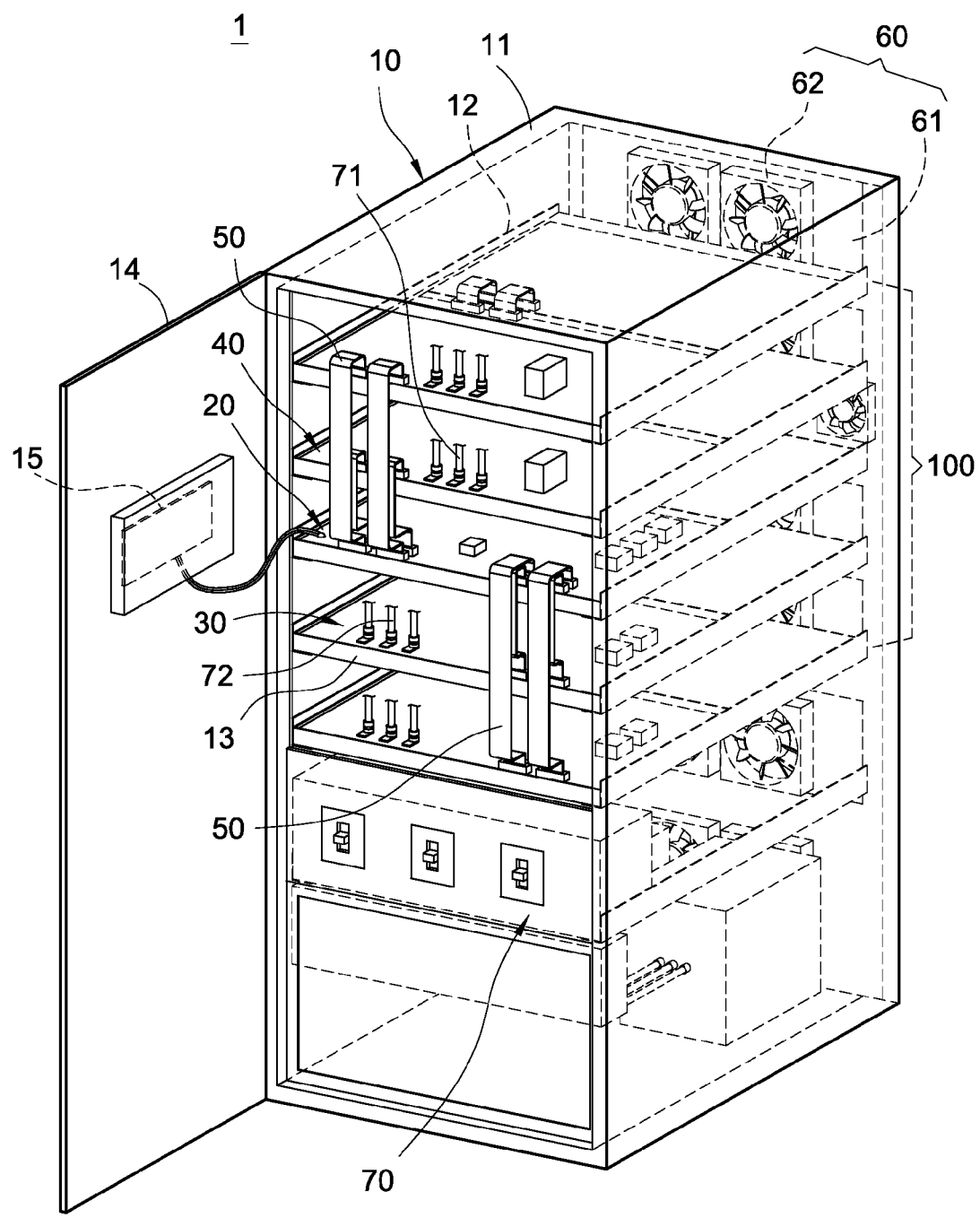
FIG. 1 is a perspective view of the present invention according to an embodiment of present invention.

The drawings will be described further in connection with the following detailed description of the present invention.

DETAILED DESCRIPTION OF THE PREFERRED EMBODIMENTS

Reference will now be made to the drawing figures to describe the present invention in detail.

Figure 2:
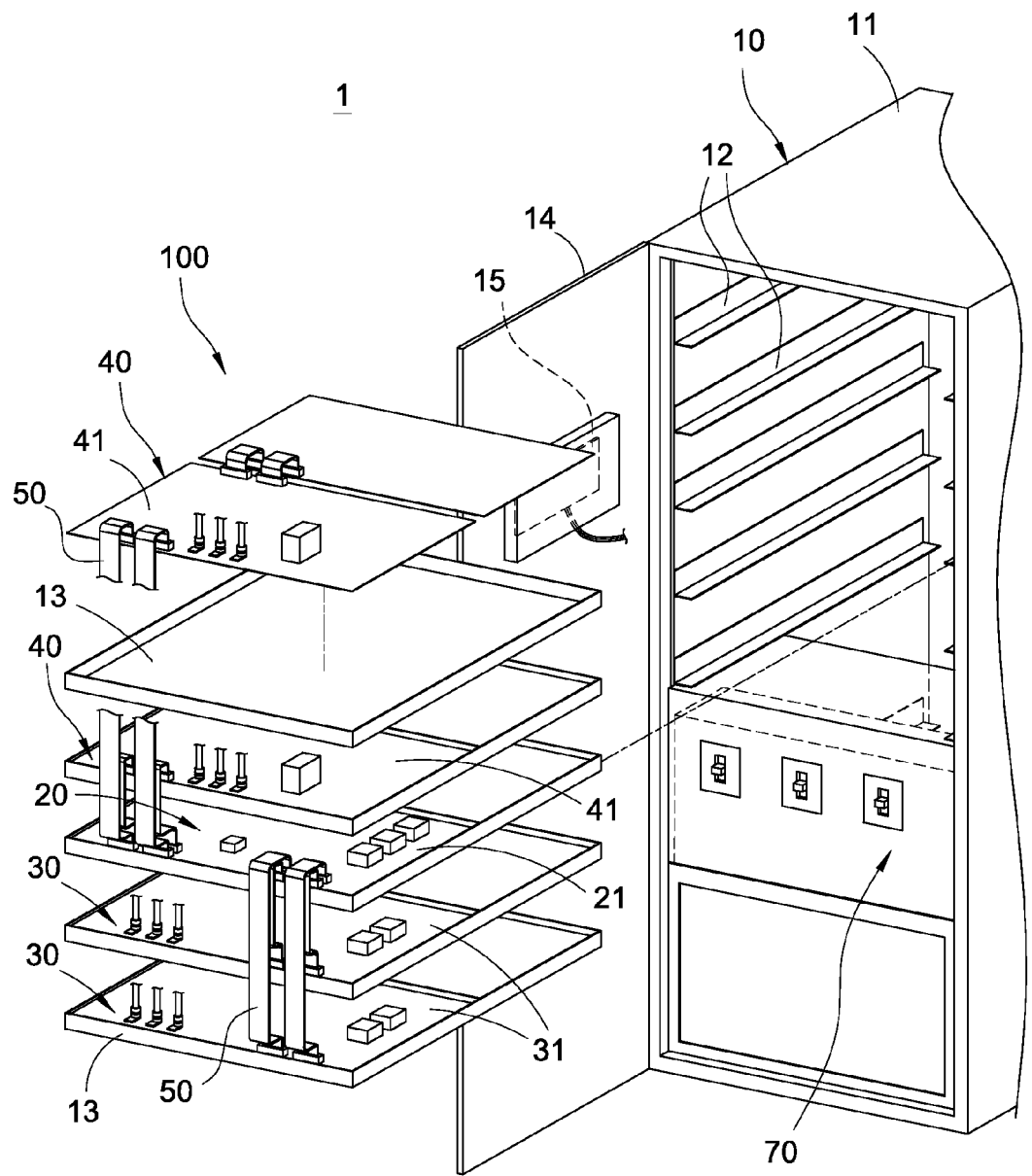
FIG. 2 is an assembled perspective view of the present invention according to an embodiment of present invention.
Figure 3:
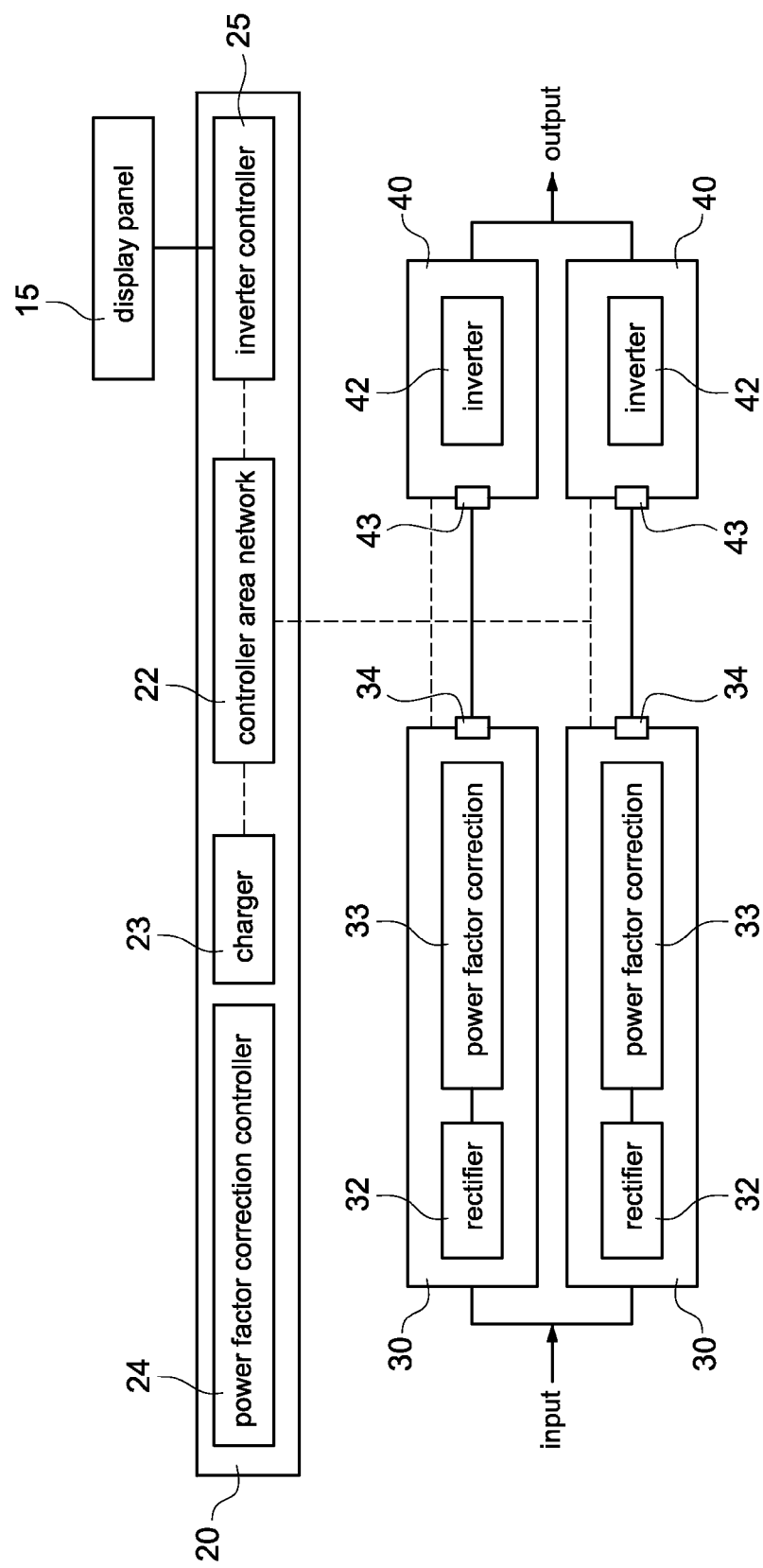
FIG. 3 is a diagram schematic view of the present invention according to an embodiment of present invention.

With reference to FIG. 1 to FIG. 3, a perspective view of the present invention, an assembled perspective view of the present invention and a diagram schematic view of the present invention are shown. An uninterruptible power supply 1 includes a cabinet 10 and a power supply unit 100. The power supply unit 100 comprises a control module 20, at least one power input module 30, at least one power output module 40 and a plurality of cables 50. The control module 20, the power input module 30 and the power output module 40 are electrically connected to each other through the cables 50.

The cabinet 10 is preferably a cuboid as shown in the figures. The cabinet 10 includes a frame 11, a plurality of rails 12 and a plurality of carrier plates 13. The rails 12 are arranged in an inner wall of the frame 11 at intervals, the carrier plates 13 are removably disposed on the rails 12. Further, the power supply unit 100 is installed in the frame 11.

Preferably, the frame 11 is a metal shell. Each rail 12 is an L-shaped bar, and the carrier plates 13 are arranged parallel to each other. Moreover, the cabinet 10 further includes a door 14 and a display panel 15 provided on the door 14. The door 14 is pivotally coupled in the front of the frame 11, and the display panel 15 is electrically connected with the control module 20.

The control module 20 is used to control the power input module 30 and power output module 40. In the present embodiment, the control module 20 is disposed in one of the carrier plates 13 and located between the power input module 30 and power output module 40.

In addition, the control module 20 includes a control circuit board 21 and a controller area network (CANbus) 22, a charger 23, a power factor correction controller 24 and an inverter controller 25 disposed on the control circuit board 21. The power factor correction controller 24 and the inverter controller 25 are electrically connected with the controller area network 22. Besides, the control module 20 communicates with the power input module 30 and the power output module 40 through the controller area network 22, and control data will be transferred to the display panel 15.

The power input module 30 is electrically connected with the control module 20 and provided in another carrier plate 13. The power input module 30 includes a power input circuit board 31 and a rectifier (REC) 32, a power factor correction 33, and an input DC bus 34 disposed on the power input circuit board 31.

Furthermore, the power output module 40 is electrically connected with the control module 20 and provided in another carrier plate 13. The power output module 40 includes a power output circuit board 41, an inverter (INV) 42 and an output DC bus 43 disposed on the power output circuit board 41.

In accordance with one embodiment of the present invention, the power supply unit 100 has a number of power input modules 30 and power output modules 40. The power input modules 30 and the power output modules 40 are placed at adjacent, and the control module 20 is placed between the power input modules 30 and the power output modules 40. Moreover, the cables 50, preferably, are flexible flat cables. The cables 50 are provided between the power input modules 30 and the power output modules 40. In real practice, the cables 50 are detachably connected with the control module 20, the power input module 30, and the power output module 40. The power input module 30 is electrically connected with the control module 20 through the cables 50 plugging in the input DC bus 34, and the power output module 40 is electrically connected with the control module 20 through the cables 50 plugging in the output DC bus 43.

In an embodiment of the present invention, the uninterruptible supply 1 further includes a fan module 60, an electric power module 70, an input power cable 71 and an output power cable 72 electrically connected with the electric power module 70. The fan module 60 includes a board 61 and at least one fan 62 disposed on the board 61, and the board 61 is swappable fixed in the backside of the frame 11.

In addition, the electric power module 70 is electrically connected with the power input module 30 through the input power cable 71, and the electric power module 70 is electrically connected with the power output module 40 through the output power cable 72. In an embodiment, the electric power module 70 is disposed on the bottom of the frame 11.

Accordingly, the control module 20, the power input module 30 or the power output module 40 of the uninterruptible power supply 1 of the present invention can be repaired or replaced individually. In real practice, the module (with the carrier plate 13) which needs to repaired or replaced can be taken out from the rails 12 from in the front of the cabinet 10 after the cables 50 are detached. Thus a purpose of repairing or replacing individually for each module will be achieved. On the contrary, conventional modular UPS must adopt expensive docking terminals with a complex docking structure. The present invention has advantages of low cost with comparing to conventional modular UPS for having simple structures and high commonality of modules, carrier plates and rails. Thus the UPS of the present has better maintainability than a traditional standalone UPS.

Figure 4:
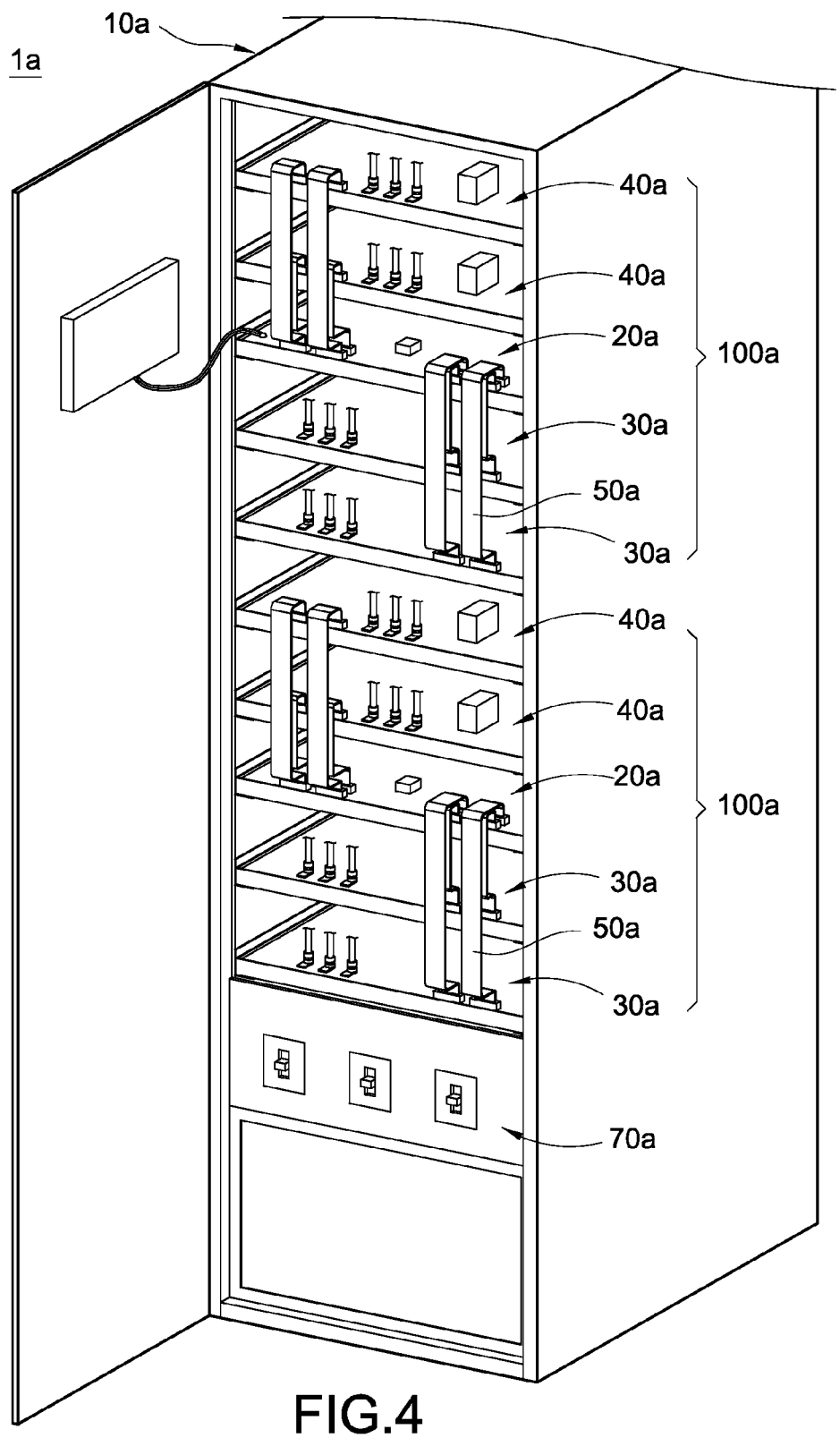
FIG. 4 is a perspective view of the present invention according to a second embodiment of present invention.

Referring to FIG. 4, a second embodiment of the UPS of the present invention is shown. In the embodiment, an uninterruptible power supply 1a includes a cabinet 10a and a plurality of power supply units 100a. The power supply units 100a are installed in the cabinet 10a individually and are electrically connected to each other.

Each power supply unit 100a comprises a control module 20a, at least one power input module 30a, at least one power output module 40a and a plurality of cables 50a. The control module 20a, the power input module 30a and the power output module 40a are disposed in the cabinet 10a and are electrically connected to each other through the cables 50a. The structures of the control module 20a, the power input module 30a and the power output module 40a are the same as the first embodiment that will not be described here again.

In an embodiment, the power supply units 100a are stacked on top of each other and electrically connected in series through the cables 50a for enhancing the power of the uninterruptible power supply 1a. In real practice, a quantity of the power supply unit 100a can be adjusted as demands.

Figure 5:
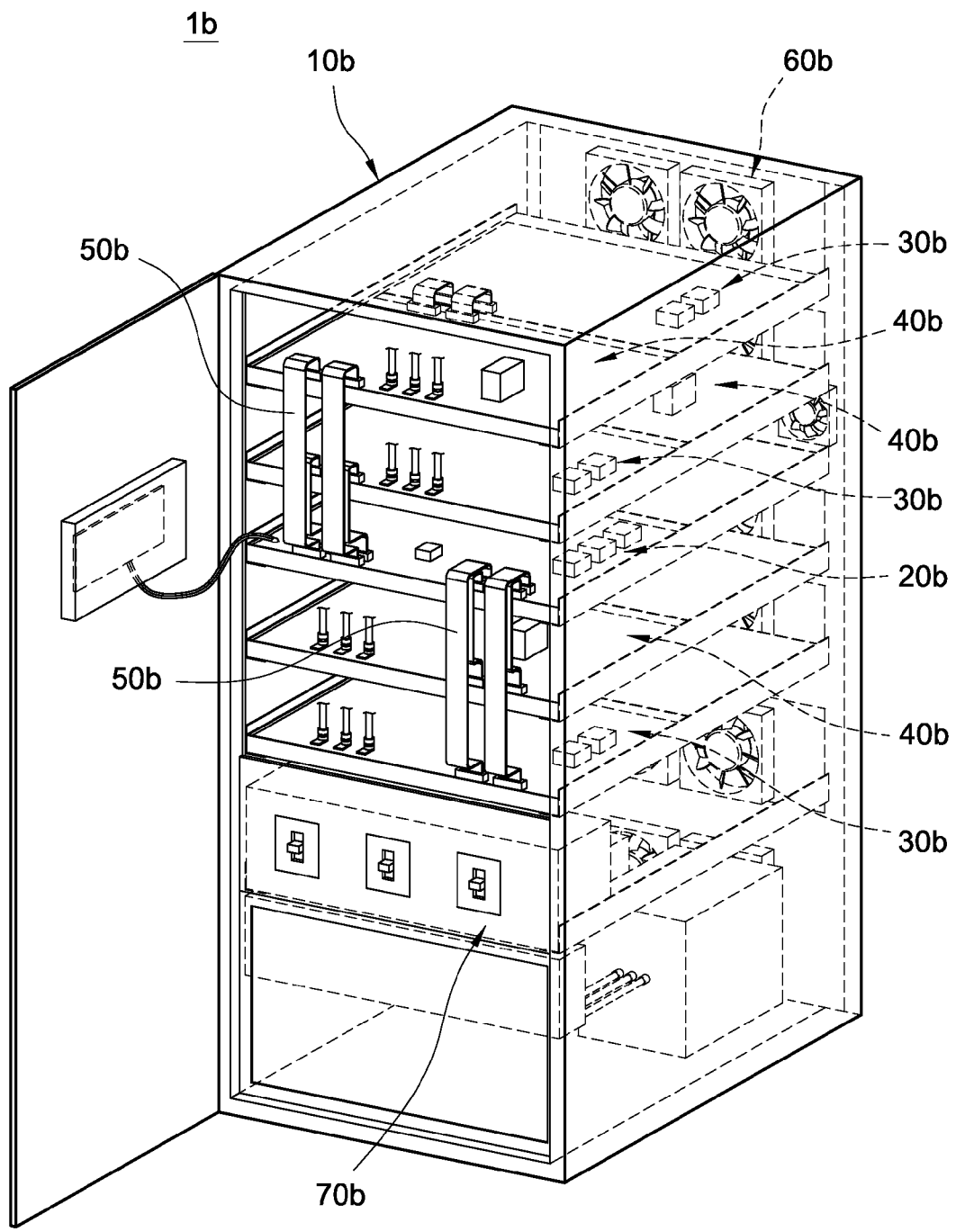
FIG. 5 is a perspective view of the present invention according to a third embodiment of present invention.

Referring now to FIG. 5, a third embodiment of the UPS of the present invention is shown. In the embodiment, an uninterruptible power supply 1b includes a cabinet 10b, a control module 20b, a plurality of power input module 30b, a plurality of power output module 40b, a plurality of cables 50b, a plurality of fan modules 60b and an electric power module 70b. The cables 50b are detachably connected with the control module 20b, the power input modules 30b and the power output modules 40b for providing electrical connectivity therebetween.

In the present invention, the control module 20b is provided in one of the carrier plate; there are a plurality of power input modules 30b and power output modules 40b. A portion of the power input modules 30b and the power output modules 40b are located in the same carrier plate; another portion of the power input modules 30b and the power output modules 40b are located in another carrier plate. That is, the power input modules 30b and the power output modules 40b can be provided in combination or separately in another carrier plate. The dispositions of the power input modules 30b and the power output modules 40b are not limited in the same carrier plate or in different carrier plates that can be adjusted as demands.

Figure 6:
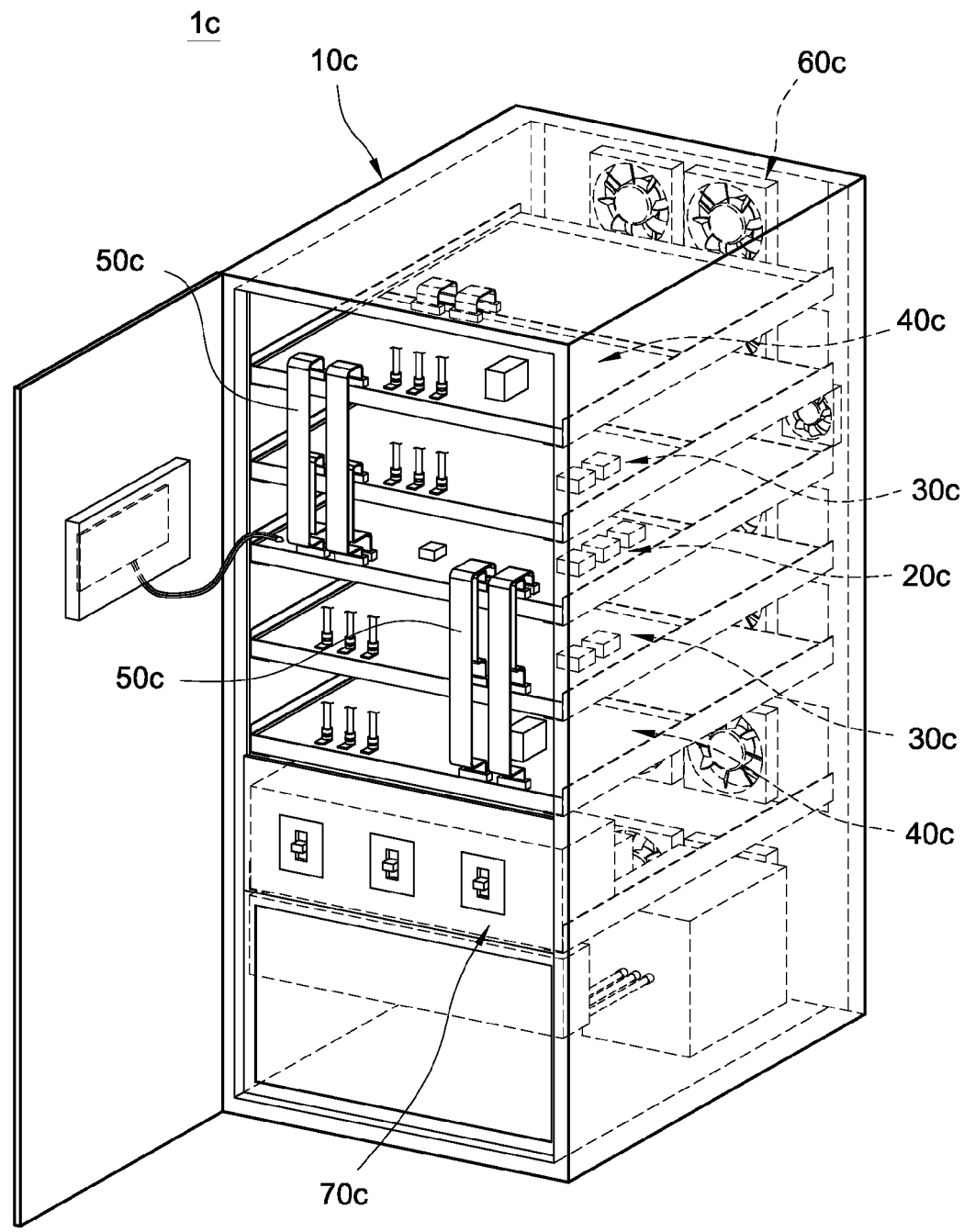
FIG. 6 is a perspective view of the present invention according to a fourth embodiment of present invention.

Further, with reference to FIG. 6, a fourth embodiment of the UPS of the present invention is shown. In the embodiment, an uninterruptible power supply 1c includes a cabinet 10c, a control module 20c, a plurality of power input module 30c, a plurality of power output module 40c, a plurality of cables 50c, a plurality of fan modules 60c and an electric power module 70c. The cables 50c are detachably connected with the control module 20c, the power input modules 30c and the power output modules 40c for providing electrical connectivity therebetween.

In accordance with one embodiment of the present invention, the control module 20c is provided in one of the carrier plate; there are a plurality of power input modules 30c and power output modules 40c. Moreover, the power input modules 30c and the power output modules 40c are provided in respective carrier plate and arranged in a stagger way. In other words, the power input modules 30c and the power output modules 40c can be provided in combination or respectively in another carrier plate. The dispositions of the power input modules 30c and the power output modules 40c can be provided in combination or separately in another carrier plate, and relative positions of the power input modules 30b and the power output modules 40b are not limited that can be adjusted as demands.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An uninterruptible power supply, comprising:
a cabinet including a frame, a plurality of rails arranged in an inner wall of the frame at intervals, and a plurality of carrier plates removably disposed on the rails; and
a power supply unit installed in the frame, including:
a control module provided in one of the carrier plates;
at least one power input module electrically connected with the control module and provided in another carrier plate;
at least one power output module electrically connected with the control module and provided in another carrier plate; and
a plurality of cables detachably connected with the control module, the power input module and the power output module, wherein the power input module and the power output module are electrically connected with the control module through the cables,
wherein
the power supply unit has a plurality of power input modules and power output modules, the power input modules and the power output modules are placed in adjacent, and the control module is placed between the power input modules and the power output modules.

2. The uninterruptible power supply in claim 1, wherein the power input module includes a power input circuit board, a rectifier, a power factor correction, an input DC bus disposed on the power input circuit board; the power output module includes a power output circuit board, an inverter and an output DC bus disposed on the power output circuit board.

3. The uninterruptible power supply in claim 1, wherein the control module includes a control circuit board and a controller area network disposed on the control circuit board, the control module communicates with the power input module and the power output module through the controller area network.

4. The uninterruptible power supply in claim 3, wherein the control module includes a charger, a power factor correction controller and an inverter controller disposed on the control circuit board, wherein the power factor correction controller and the inverter controller are electrically connected with the controller area network.

5. The uninterruptible power supply in claim 1, wherein the cabinet further includes a door and a display panel provided on the door, the door is pivotally coupled in the front of the frame, and the display panel is electrically connected with the control module.

6. The uninterruptible power supply in claim 1, further including a fan module, wherein the fan module includes a board and at least one fan disposed on the board, and the board is swappable fixed in the backside of the frame.

7. The uninterruptible power supply in claim 1, further including an electric power module, an input power cable and an output power cable electrically connected with the electric power module; the electric power module is electrically connected with the power input module through the input power cable, and the electric power module is electrically connected with the power output module through the output power cable.

8. The uninterruptible power supply in claim 7, wherein the electric power module is disposed on the bottom of the frame.

9. An uninterruptible power supply, comprising:
a cabinet including a frame, a plurality of rails arranged in an inner wall of the frame at intervals, and a plurality of carrier plates removably disposed on the rails; and
a power supply unit installed in the frame, including:
a control module provided in one of the carrier plates;
at least one power input module electrically connected with the control module;
at least one power output module electrically connected with the control module; and
a plurality of cables detachably connected with the control module, the power input module and the power output module; wherein the power input module and the power output module are provided in combination or separately on another carrier plate, the power supply unit has a plurality of power input modules and power output modules, and a portion of the power input modules and the power output modules are provided in the same carrier plate.

10. The uninterruptible power supply in claim 9, wherein the power input module includes a power input circuit board, a rectifier, a power factor correction and an input DC bus disposed on the power input circuit board, the power input module is electrically connected with the control module through the cables plugging in the input DC bus.

11. The uninterruptible power supply in claim 9, wherein the power output module includes a power output circuit board, an inverter and an output DC bus disposed on the power output circuit board, the power output module is electrically connected with the control module through the cables plugging in the output DC bus.

12. An uninterruptible power supply, comprising:
a cabinet including a frame, a plurality of rails arranged in an inner wall of the frame at intervals, and a plurality of carrier plates removably disposed on the rails; and
a power supply unit installed in the frame, including:
a control module provided in one of the carrier plates;
at least one power input module electrically connected with the control module;
at least one power output module electrically connected with the control module; and
a plurality of cables detachably connected with the control module, the power input module and the power output module;
wherein the power input module and the power output module are provided in combination or separately on another carrier plate, the power supply unit has a plurality of power input modules and power output modules, and a portion of the power input modules and the power output modules are placed individually in the carrier plate and arranged in a stagger way.

13. The uninterruptible power supply in claim 12, wherein the power input module includes a power input circuit board, a rectifier, a power factor correction and an input DC bus disposed on the power input circuit board, the power input module is electrically connected with the control module through the cables plugging in the input DC bus.

14. The uninterruptible power supply in claim 12, wherein the power output module includes a power output circuit board, an inverter and an output DC bus disposed on the power output circuit board, the power output module is electrically connected with the control module through the cables plugging in the output DC bus.

* * * * *